(12) United States Patent
Cai et al.

(10) Patent No.: US 8,415,743 B2
(45) Date of Patent: Apr. 9, 2013

(54) ETSOI CMOS WITH BACK GATES

(75) Inventors: Jin Cai, Cortlandt Manor, NY (US);
Robert H Dennard, Croton-on-Hudson, NY (US); Ali Khakifirooz, Mountview, CA (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 13/114,410

(22) Filed: May 24, 2011

(65) Prior Publication Data

US 2012/0299105 A1    Nov. 29, 2012

(51) Int. Cl.
*H01L 27/092* (2006.01)

(52) U.S. Cl. ............... 257/348; 257/E27.061

(58) Field of Classification Search .......... 257/348, 257/376, 402, E27.061
See application file for complete search history.

(56) References Cited

U.S. PATENT DOCUMENTS

| | | |
|---|---|---|
| 5,103,277 A | 4/1992 | Caviglia et al. |
| 5,185,535 A | 2/1993 | Farb et al. |
| 5,610,083 A | 3/1997 | Chan et al. |
| 5,619,054 A | 4/1997 | Hashimoto |
| 5,892,260 A * | 4/1999 | Okumura et al. ............ 257/347 |
| 6,010,926 A | 1/2000 | Rho et al. |
| 6,121,821 A | 9/2000 | Miki |
| 6,249,458 B1 | 6/2001 | Shokouhi et al. |
| 6,661,042 B2 | 12/2003 | Hsu |
| 6,876,055 B2 | 4/2005 | Iwata et al. |
| 6,972,478 B1 | 12/2005 | Waite et al. |
| 7,052,966 B2 | 5/2006 | Kar-Roy et al. |
| 7,115,950 B2 * | 10/2006 | Tokushige ............ 257/351 |
| 7,242,071 B1 | 7/2007 | Liu et al. |
| 7,358,573 B2 | 4/2008 | Cecchi et al. |
| 7,537,978 B2 | 5/2009 | Yagishita et al. |
| 7,570,509 B2 | 8/2009 | Takizawa |
| 7,772,649 B2 | 8/2010 | Cheng et al. |
| 2007/0029620 A1 | 2/2007 | Nowak |
| 2009/0160531 A1 | 6/2009 | Law et al. |
| 2010/0117122 A1 | 5/2010 | Benoit et al. |
| 2010/0173459 A1 | 7/2010 | Kerr et al. |
| 2010/0258872 A1 | 10/2010 | Sugii et al. |

FOREIGN PATENT DOCUMENTS

| | | |
|---|---|---|
| JP | 07-273184 | 10/1995 |
| JP | 2005-159245 | 6/2005 |
| KR | 2006070025 | 6/2006 |

OTHER PUBLICATIONS

M. Khater et al., "FDSOI CMOS with Dielectrically-Isolated Back Gates and 30nm LG High-k/Metal Gate", 2010 Symposium on VLSI Technology Digest of Technical Papers.
Y. Shimamoto et al., "Advantages of Gate Work-Function Engineering by Incorporating Sub-Monolayer Hf at SiON/Poly-Si Interface in Low-Power CMOS", 2005 Symposium on VLSI Technology Digest of Technical Papers.

* cited by examiner

*Primary Examiner* — Chandra Chaudhari
(74) *Attorney, Agent, or Firm* — Harrington & Smith

(57) ABSTRACT

A structure has a functional region having a first type of conductivity and a top surface. The functional region is connected to a bias contact. The structure further includes an insulating layer; a semiconductor layer and first and second transistor devices having the same type of conductivity disposed upon the semiconductor layer. The structure further includes a first back gate region adjacent to the top surface and underlying one of the transistor devices, the first back gate region having a second type of conductivity; and a second back gate region adjacent to the top surface and underlying the other one of the transistor devices, the second back gate region having the first type of conductivity. The first transistor device has a first characteristic threshold voltage and the second transistor device has a second characteristic threshold voltage that differs from the first characteristic threshold voltage.

11 Claims, 7 Drawing Sheets

| Design Examples | A | B | C |
|---|---|---|---|
| SRAM gate WF (G1) | 0 | 0 | 0 |
| Logic nFET gate WF (G2) | +0.1 | +0.2 | +0.2 |
| Logic pFET gate WF (G3) | 0 | -0.1 | -0.05 |
| $T_{BOX}$ (nm) | 20 | 20 | 14 |
| SRAM Vt (V) | 0.35 | 0.35 | 0.35 |
| Logic HVT Vt (V) | 0.35 | 0.25 | 0.3 |
| Logic RVT Vt (V) | 0.25 | 0.15 | 0.15 |

FIG. 3

ETSOI CMOS WITH BACK GATES

TECHNICAL FIELD

The exemplary embodiments of this invention relate generally to semiconductor devices and fabrication techniques and, more specifically, relate to the fabrication of semiconductor transistor devices, such as those used in static random access memory (SRAM) and logic circuitry, using an extremely thin silicon on insulator (ETSOI) substrate, also referred to as a fully-depleted silicon on insulator (FDSOI) substrate.

BACKGROUND

In silicon on insulator (SOI) technology a thin silicon layer is formed over an insulating layer, such as silicon oxide, which in turn is formed over a bulk substrate. This insulating layer is often referred to as a buried oxide (BOX) layer or simply as a BOX. For a single BOX SOI wafer the thin silicon layer is divided into active regions by shallow trench isolation (STI) which intersects the BOX and provides a total isolation for active device regions formed in the silicon layer. Sources and drains of field effect transistors (FETs) are formed, for example, by ion implantation of N-type and/or P-type dopant material into the thin silicon layer with a channel region between the source and drain using the gate pattern to self-define the channel region. Prior to the formation of sources and drains, gates are formed on top of the channel region, for example, by deposition of a gate dielectric and conductor on the top surface of the thin silicon, followed by photolithographic patterning and etching. So-called back gates can also be formed under the active region on a single BOX SOI wafer using the BOX layer as the back gate dielectric. The back gates can be defined by either p or n type dopant implantation into the substrate.

Transistors having back gates typically use relatively thin silicon and BOX layers to enable fully depleted device operation with a threshold voltage which is responsive to the back gate. Such FETs built in thin SOT technology with back gates have significant advantages such as, for example, reduced short channel effects, less threshold variability due to body doping fluctuations, and an ability to use the back gate voltage to adjust the threshold.

A complementary doped back gate scheme for dual Vt design is discussed in 'FDSOI CMOS with Dielectrically-Isolated Back Gates and 30 nm LG High-k/Metal Gate' by M. Khater, et. al, in the 2010 VLSI Technology Symp. In this paper a second buried oxide layer is placed under the back gates, along with a second shallow trench isolation for the back gates. Different threshold voltages were obtained by applying different voltages to the back gates.

SUMMARY

In accordance with the exemplary embodiments of this invention there is provided a structure that comprises a functional region having a first type of conductivity and a top surface, the functional region connected to a contact for applying a bias potential to the functional region; an insulating layer disposed over the top surface; a semiconductor layer disposed over the insulating layer; and a first transistor device disposed upon the semiconductor layer and a second transistor device disposed upon the semiconductor layer. Each transistor device comprises a source, a drain and a gate stack defining a channel between the source and the drain. The first transistor device and the second transistor device have the same type of conductivity. The structure further comprises a first back gate region adjacent to the top surface of the functional region and underlying one of the transistor devices, the first back gate region having a second type of conductivity; and a second back gate region adjacent to the top surface of the functional region and underlying the other one of the transistor devices, the second back gate region having the first type of conductivity. The first back gate region is electrically floating and is biased by leakage and capacitive coupling to the functional region, and the second back gate region is directly connected to the functional region.

Further in accordance with the exemplary embodiments of this invention there is provided a method to fabricate a structure. The method comprises providing a wafer comprising a semiconductor substrate and a top surface, an insulating layer disposed over the top surface and a semiconductor layer disposed over the insulating layer; implanting through the semiconductor layer and the insulating layer a functional region to be adjacent to the top surface of the substrate, the functional region having a first type of conductivity; implanting through the semiconductor layer and the insulating layer a back gate region to be adjacent to the top surface, of the substrate and within the functional region, the back gate region having a second type of conductivity; forming isolation regions in the semiconductor layer at predetermined locations corresponding to locations of subsequently formed first and second transistor devices; forming the first and second transistor devices to have the same type of conductivity over the semiconductor layer such that one of the transistor devices overlies the implanted back gate region and the other one of the transistor devices overlies only the underlying top surface of the functional region not overlapped by the implanted back gate region. The implanted back gate region is not connected to an electrical contact so that during operation it is biased by leakage and capacitive coupling to the same potential as a functional region of the substrate in which it is implanted and with which it forms a diode junction. The method further includes providing an electrical contact to the functional region for applying a bias voltage.

Further in accordance with the exemplary embodiments of this invention there is provided a structure that comprises a functional region having a first type of conductivity and a top surface, the functional region connected to a first contact for applying a bias potential to the functional region; an insulating layer disposed over the top surface and a semiconductor layer disposed over the insulating layer. The structure further comprises a first transistor device disposed upon the semiconductor layer and a second transistor device disposed upon the semiconductor layer, each transistor device comprising a source, a drain and a gate stack defining a channel between the source and the drain. The first transistor device has a first type of conductivity and the second transistor device has a second type of conductivity. The structure further comprises a back gate plate adjacent to the top surface of the functional region and underlying both the first and second transistor devices, the back gate plate having a second type of conductivity. The back gate plate is one of electrically floating and is biased during operation by leakage and capacitive coupling to a same potential as the functional region with which it forms a diode junction, or it is biased through a back gate plate contact. The structure further comprises a third transistor device disposed upon the semiconductor layer and a fourth transistor device disposed upon the semiconductor layer. Each of the third and fourth transistor devices comprise a source, a drain and a gate stack defining a channel between the source and the drain, where the third and fourth transistor devices have the same type of conductivity. The structure further comprises a first back gate region adjacent to the top surface of the functional region and underlying one of the third and fourth transistor devices, the first back gate region having the second type of conductivity; and a second back gate region adjacent to the top surface of the functional region and underlying the other one of the third and fourth transistor devices, the second back gate region having the first type of conductivity. The first back gate region is electrically floating and is biased during operation by leakage and capacitive coupling to the same potential as the functional region with which it forms a diode junction,. The second back gate region is directly connected to the functional region.

BRIEF DESCRIPTION OF THE SEVERAL VIEWS OF THE DRAWINGS

FIG. 3 depicts three different design examples where three Vt values can be configured, one for SRAM (FIG. 1) and two for MOS logic circuits (FIG. 2C).

DETAILED DESCRIPTION

Figure 1A:
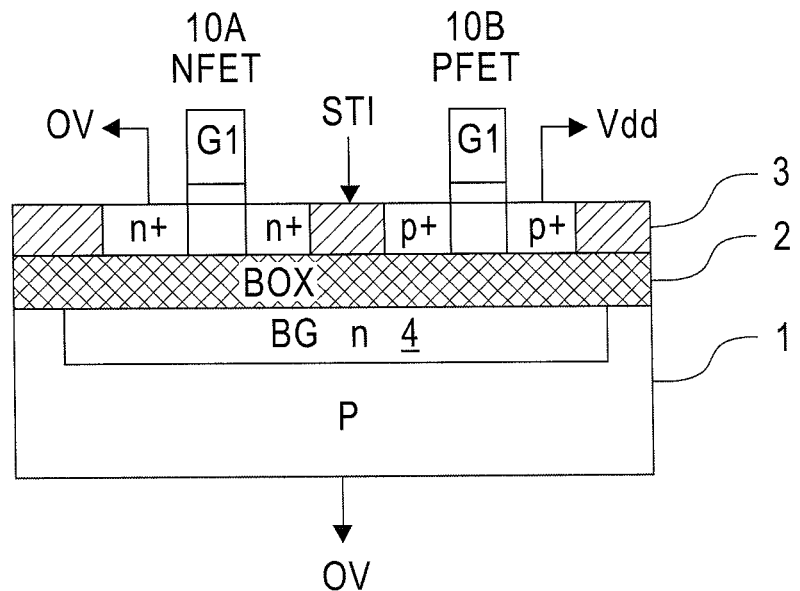
FIGS. 1A and 1B, collectively referred to as FIG. 1, each present a cross-sectional enlarged view (not to scale) of a portion of an ETSOI wafer suitable for use with SRAM embodiments, where in FIG. 1A common back gate plate is electrically floating, and where in FIG. 1B the common back gate plate is connected to a bias source.

Undoped fully-depleted ETSOI structures provide many advantages over more conventional doped body structures. Continued device scaling for ETSOI structures requires a relatively thin BOX layer and doped substrate regions acting as back gates. The use of the embodiments of this invention provide an ability to fabricate dense CMOS (complementary metal oxide semiconductor) circuits such as SRAM (static random access memory), as well as dual-Vt (threshold voltage) CMOS logic circuits, that employ only a common substrate bias contact to the ETSOI substrate. The SRAM and logic circuits can be fabricated on the same substrate. As a non-limiting example the SRAM and logic circuits can form a part of a microprocessor device, where the SRAM provides data storage and the logic circuits form a part of the microprocessor logic circuitry used to construct, for example, an address decoder and address translation unit, an arithmetic logic unit (ALU) and other types of logic circuitry.

The back gate of an ETSOI CMOS device is analogous to the body of a bulk MOSFET (metal oxide semiconductor field effect transistor). In a most straightforward implementation this implies the use of n-type back gates biased at Vdd for p-type transistors and p-type back gates biased at ground potential for n-type transistors. With this approach separate electrical contacts to the n-type and p-type back gates are needed, and the circuit density is limited by the minimum distance between the n-type and p-type back gates.

The exemplary embodiments clearly improve over the prior art, as the exemplary embodiments of this invention provide enhanced ETSOI structures using as back gates doped substrate regions of similar doping concentration but different doping types, where the back gates are biased to a common potential with a functional region with which one or more of the back gates form a diode junction (p-n junction). In one exemplary embodiment an ETSOI structure provides relatively high-Vt complementary MOS transistors with the same gate material and back gate doping type used for both p-type and n-type transistors, thereby enabling a dense layout of CMOS circuits such as, but not limited to, arrays of SRAM cells. In a further exemplary embodiment an ETSOI structure has different doping types in the back gate regions, and all back gate regions have one common potential requiring only one contact to the common functional region. This ETSOI structure enables dual-Vt n-type transistors (or p-type transistors) with one common functional region bias and the same type of gate material, or dual-Vt CMOS with one common functional region bias and two gate materials (one for p-type and one for n-type transistors).

The common functional region bias in the embodiments of the ETSOI structures is nominally set at either the source potential of the n-type transistor (e.g., ground) in the case of a p-type functional region or at the source potential of the p-type transistor (e.g., Vdd) for an n-type functional region. The common bias can be adjusted to balance any asymmetry between n-type and p-type transistors due to tolerances in the respective gate work function or due to BOX charge or any charge in the thin silicon layer common to all devices.

Various embodiments of the ETSOI structures can be realized on the same common substrate for enabling the integration of, for example, SRAM and logic functions on the same common substrate.

At the outset it is noted that as employed herein a "functional region" implies the presence of some volume of material that has a first type of conductivity, e.g., p-type conductivity. In some embodiments the functional region may be considered to include the entire substrate, such as when the substrate has a substantially uniform doping concentration. In other exemplary embodiments the functional region may encompass only a portion of the substrate, such as an upper portion (thickness) of the substrate that underlies the BOX. This can be the case where, for example, the upper portion has a different doping concentration, or even a different conductivity type, than the remainder (underlying portion) of the substrate.

An aspect of the exemplary embodiments of this invention is the presence of an electrically floating back gate region having a conductivity type opposite to the conductivity type of the functional region (e.g., the functional region is p-type and the floating back gate region is n-type). The electrically floating back gate region underlies at least one transistor device and is located (at least partially) in the functional region and forms a diode junction with the adjacent portion of the functional region. The functional region is connected to an electrical contact, which could be a substrate contact, which can be used to apply a bias voltage. The electrically floating back gate region assumes the same DC voltage potential as the adjacent functional region due at least to leakage and the capacitance characteristics of the diode junction formed between the electrically floating back gate region and the adjacent biased functional region. This back gate region does not need to be directly connected to a source of bias potential via a contact. This feature is advantageous for a number of reasons, such as facilitating dense logic circuit layouts, as will be made evident below. As such, references herein to a functional region can be construed as implying the entirety of the substrate or just a portion of the substrate.

Figure 1B:
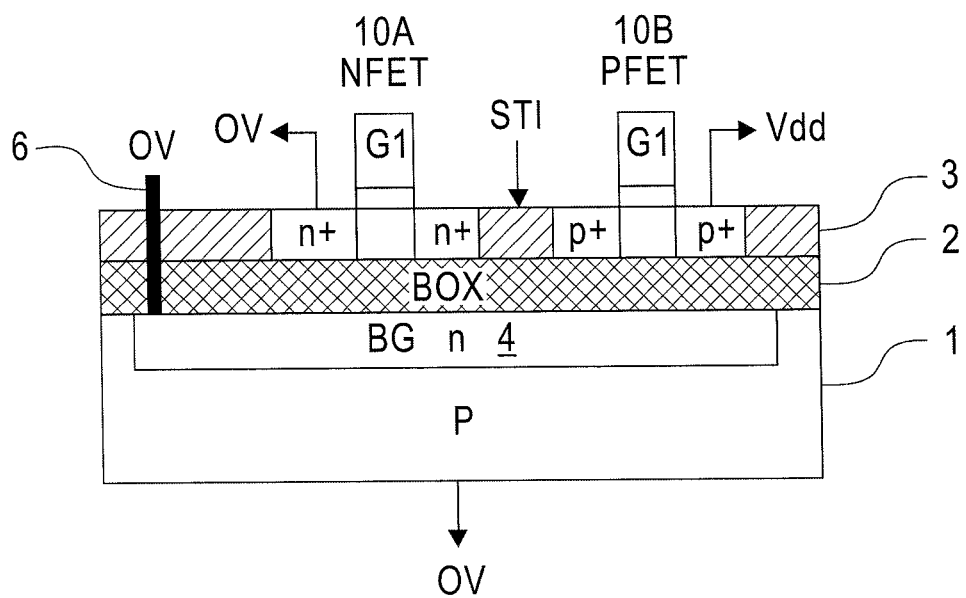

FIGS. 1A and 1B present a cross-sectional enlarged view (not to scale) of a portion of an ETSOI wafer. In FIG. 1A the wafer includes a p-type region 1, a BOX layer 2 (e.g., about 10 to about 50 nm thick) and a thin Si layer 3 (e.g., generally less than about 10 nm in thickness, such as about 5-7 nm in thickness). Silicon layers of this thickness can be considered as being "extremely thin", and thus the overall structure may be characterized as being an ETSOI structure. The Si layer 3 is depicted as being selectively retained only where desired, such as for various FETs 10 including an nFET 10A and a pFET 10B. In FIG. 1A there is a common mid-gap gate material (G1) for the nFET 10A and the pFET 10B and a common back gate (BG) plate or region 4 for the nFET and the pFET. The common back gate plate in FIG. 1A has an n-type doping. The Si layer 3 is not continuous and is separated by shallow trench isolation (STI) between transistor devices. In FIG. 1A the supply voltage is labeled for the two source regions only, 0V for the nFET 10A and Vdd for the pFET 10B. The supply voltage for the drain regions (the two regions in the middle) are not labeled as the value depends of the circuit configuration. In FIG. 1A the common back gate is electrically floating as was described above.

Reference is now made to FIG. 1B that corresponds in large measure to FIG. 1A. It can be noted that for nFETs and pFETs in a dense SRAM cell a floating back gate is not necessary to obtain the threshold voltage. Since all of the devices in a large SRAM array can share the same back gate (plate), there are no area constraints and a contact 6 (e.g., a top-side contact) can be fabricated to directly supply a bias voltage to the common back gate plate 4. For the p-type region 1 of FIG. 1B, biased at ground potential, the contact 6 can apply a back gate bias equal to ground, or it can be varied to optimize the performance of the SRAM independently.

In FIGS. 1A and 1B, and in the FIGS. 2A, 2B, 2C, 4 and 5, the functional region is designated as 1. The functional region 1 can be equivalent to the entirety of the substrate, or it can be just a portion of the substrate, such as the upper-most portion underlying the BOX 2. The BOX 2 can be generalized as being or forming a part of an "insulating layer" that is comprised of only an oxide (e.g., $SiO_2$), or of an oxide in combination with some other insulating material (e.g., see FIG. 5), or some insulating material other than one containing $SiO_2$.

In these embodiments, and the other embodiments described below, mid-gap refers to the middle of the silicon energy gap. With the silicon conduction band edge at about 4.05 eV and the silicon valence band edge at about 5.17 eV, the mid-gap gate material has a work function of about (5.17 eV+4.05 eV)/2=4.61 eV. These embodiments provide a high-Vt (HVT) (>0.3V) and enable a high density array of SRAM devices to be fabricated.

Figure 2A:
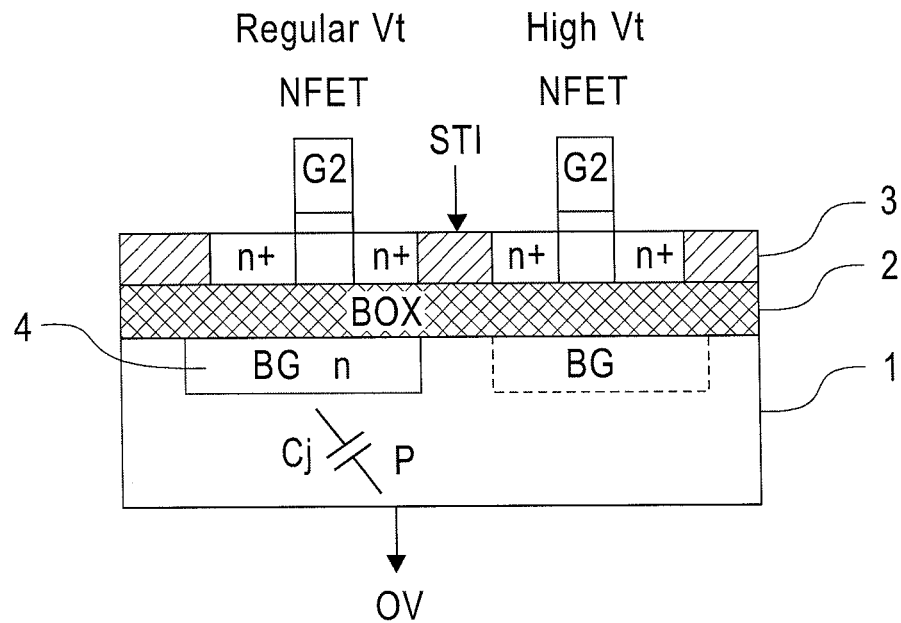
FIG. 2A presents a cross-sectional enlarged view (not to scale) of a portion of the same or a different ETSOI wafer as in FIGS. 1A and 1B suitable to realize dual Vt NFETs for logic applications.

FIG. 2A presents a cross-sectional enlarged view (not to scale) of a portion of the same or a different ETSOI wafer as in FIG. 1A or 1B suitable to realize two Vts for n-type transistors for logic applications. In this case two nFETs have the same gate work function (G2). The common p-type region (the functional region 1) is nominally biased at the source potential of the nFET (0V) and the floating n-type back gate region 4 has the same potential as the functional region 1 (0V). In this case leakage current and capacitive (Cj) displacement current between the n-type back gate region 4 and the functional region 1 is sufficient to stabilize the floating n-type back gate potential during AC operation.

Further in this regard it is pointed out that the material of the functional region 1 that lies beneath the nFET on the right side, shown in dashed outline, functions as a back gate for the device. In this case the p-type back gate is directly connected to the functional region 1 potential (0V), as opposed to being indirectly (e.g., capacitively) coupled to the potential of the functional region 1 as is the n-type back gate 4.

The nFET on the right side that overlies the p-type back gate acquires a higher characteristic threshold voltage than the nFET on the left side that overlies the floating n-type back gate. Dual Vt (regular Vt (RVT) and high Vt (HVT)) nFETs are thus enabled by the use of two back gates with different doping types.

Figure 2B:
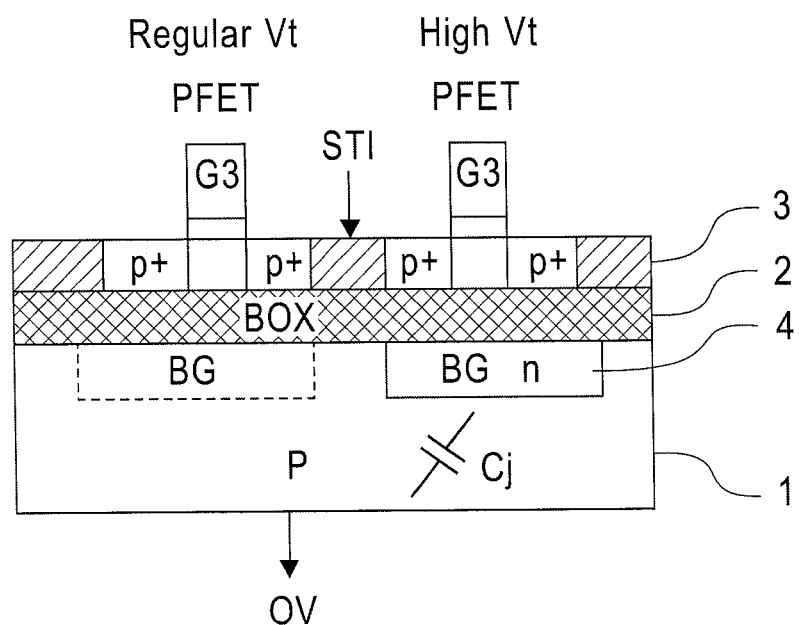
FIG. 2B presents a cross-sectional enlarged view (not to scale) of a portion of the same or a different ETSOI wafer as in FIGS. 1A and 1B suitable to realize dual Vt PFETs for logic applications.

FIG. 2B presents a cross-sectional enlarged view (not to scale) of a portion of the same or a different ETSOI wafer as in FIG. 1A or 1B suitable to realize two different Vts for p-type transistors for logic applications. In this case two pFETs have the same gate work function (G3). The common functional region 1 is nominally biased at 0V and the floating n-type back gate region 4 has the same potential as the functional region 1 (0V). In this case leakage current and capacitive (Cj) displacement current between the n-type back gate region 4 and the functional region 1 is sufficient to stabilize the floating n-type back gate potential during AC operation.

Further in this regard it is pointed out that the material of the functional region 1 that lies beneath the pFET on the left side, shown in dashed outline, functions as a back gate for the device. In this case the p-type back gate is directly connected to the functional region 1 potential (0V), as opposed to being indirectly (e.g., capacitively) coupled to the potential of the functional region 1 as is the n-type back gate 4.

The pFET on the right side that overlies the n-type floating back gate acquires a higher characteristic threshold voltage than the pFET on the left side that overlies the p-type back gate. Dual Vt (regular Vt (RVT) and high Vt (HVT)) pFETs are thus enabled by the use of two back gates with different doping types.

Figure 2C:
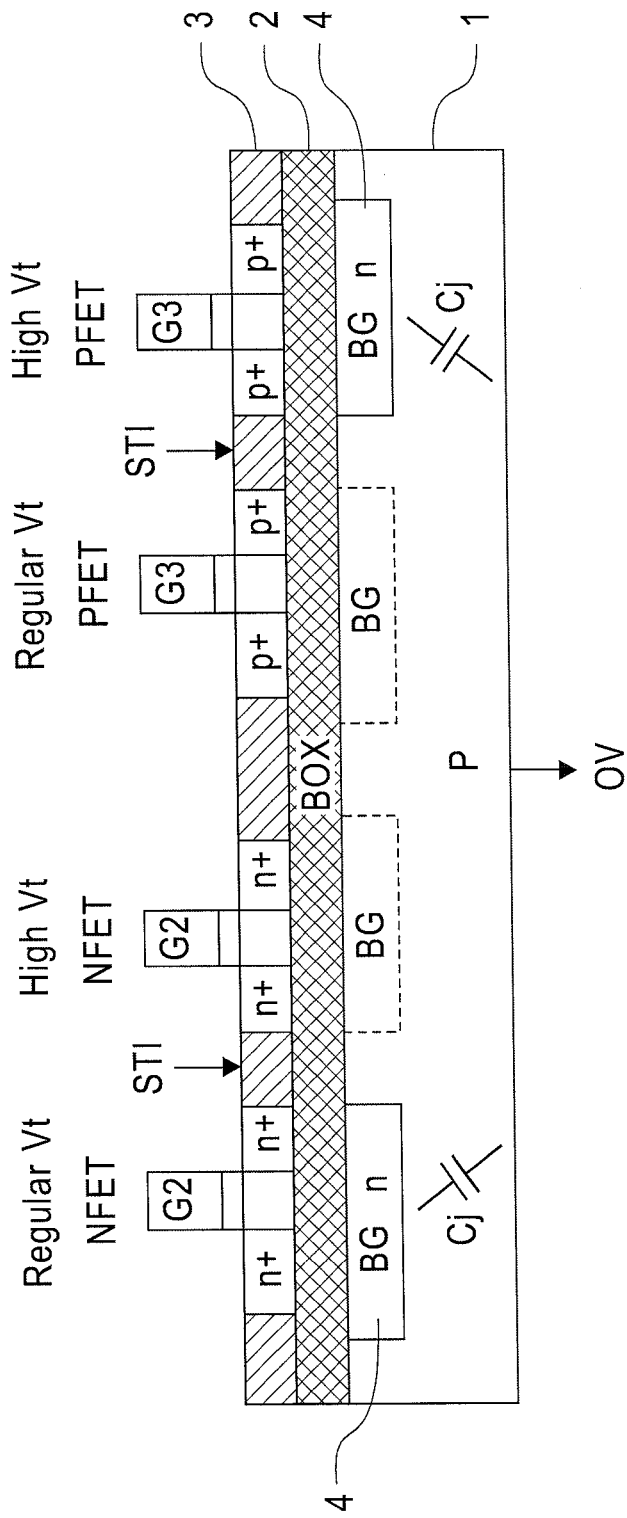
FIG. 2C shows an example of a further embodiment having the dual Vt NFETs of FIG. 2A and dual Vt PFETs of FIG. 2B disposed on the same substrate for complementary MOS logic applications.

FIG. 2C presents the dual Vt nFETs of FIG. 2A and dual Vt pFETs of FIG. 2B integrated on a functional region in an ETSOI substrate. This is a particularly useful embodiment of this invention where the same transistor types are provided with the same gate work function (e.g., G2 for nFETs and G3 for pFETs) but exhibit different threshold voltages depending on the underlying back gate. For example in the left side of the Figure there are two nFETs with the same gate work function, where the regular Vt nFET is disposed above an n-type back gate 4 and the high Vt nFET is disposed above a p-type back gate (upper portion of functional region 1). In the right side of the Figure there are two pFETs with the same gate work function, where the high Vt pFET is disposed above an n-type back gate 4 and the regular Vt pFET is disposed above a p-type back gate (upper portion of functional region 1).

In general, to achieve a high Vt device an nFET is disposed over the p-type back gate while a pFET is disposed over an n-type back gate.

Discussed now are several non-limiting examples. In general the choice of the nFET gate work function (G2) sets the Vt value for the RVT nFET and the choice of the pFET gate work function (G3) sets the Vt value for the HVT pFET. If, by example, a mid-gap work function is used for the pFET (G3=G1), the HVT pFET has the same Vt as the SRAM device of FIG. 1A, Vt~−0.35V. A change of the doping type of the back gate from n-type to p-type (as shown in the dashed outlines in FIG. 2C) raises the nFET Vt (HVT nFET), and decreases the pFET Vt (RVT pFET). The amount of the change is a function of the thickness of the insulating layer, the BOX 2 ($T_{BOX}$) in this example. For example, |→Vt| is approximately 0.1V for a BOX 2 thickness of 20 nm with a 7 nm thick Si layer 3 and 0.8 nm equivalent oxide thickness (EOT). The RVT nFET would have the same Vt~0.35V as the SRAM device in FIG. 1A if the mid-gap work function were used. The HVT nFET would then have a Vt~0.45V, about 0.1V higher than that of the HVT pFET. For symmetric Vt designs, e.g., !0.35V for the HVT nFET and HVT pFET respectively, and !0.25V for the RVT nFET and RVT pFET respectively, the nFET gate work function (G2) can be set to be about 0.1 eV above the mid-gap level (or 4.51 eV).

As is shown in FIG. 3, for three different design examples A, B and C three Vt values can be configured, one for SRAM (FIG. 1) and two for logic circuits for each transistor type (FIG. 2C). In FIG. 3 the gate work function is: 0 (silicon mid-gap), +(above silicon mid-gap towards conduction band edge), −(below silicon mid-gap towards valence band edge).

Figure 4:
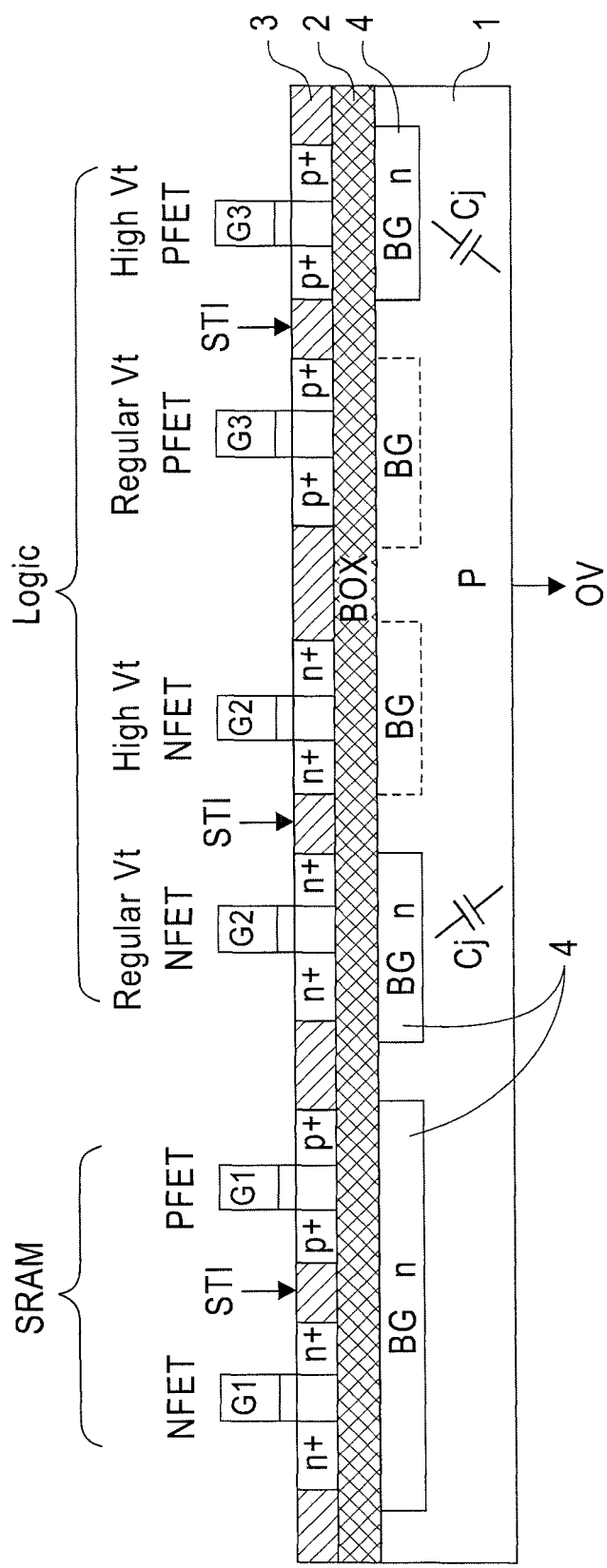
FIG. 4 shows an example of a further embodiment with the SRAM circuit of FIG. 1A and the logic circuits of FIG. 2C disposed on the same substrate.

FIG. 4 shows an example of the SRAM circuit of FIG. 1A and the logic circuits of FIG. 2C disposed on the same substrate (disposed on the same functional area 1). In a simple process flow fabrication begins with the p-substrate (e.g., $1 \times 10^{18}/cm^3$ doping) and n+ implants are made where needed (e.g., $2 \times 10^{18}/cm^3$ doping). The p-substrate is grounded via a suitable substrate contact. There is no n-type back gate 4 contact, instead the n-type back gates 4 are floating and coupled to ground through the p-type substrate (through the functional region 1). The SRAM array is located on a common n-type plate (back gate 4), and a mid-gap gate work function is selected for both the n-type and the p-type devices providing a Vt of approximately 0.35V. The logic nFET with the gate work function above mid-gap, e.g., +0.1 eV, with no work function tuning capping layer (e.g. aluminum) provides increased electron mobility. The logic pFET is provided with a mid-gap or below mid-gap gate work function. The dual logic Vt design is achieved by the different back gate doping types and the presence of a relatively thin BOX 2 ($T_{BOX}$~20 nm).

In FIG. 4 the SRAM embodiment of FIG. 1B could be used as well, where the topside contact 6 is used to bias the back gate plate 4.

The substrate bias provides a mechanism for balancing nFET and pFET Vt if desired. In this case the substrate contact is not connected directly to ground potential, but can instead be connected to a controlled bias source.

Figure 5:
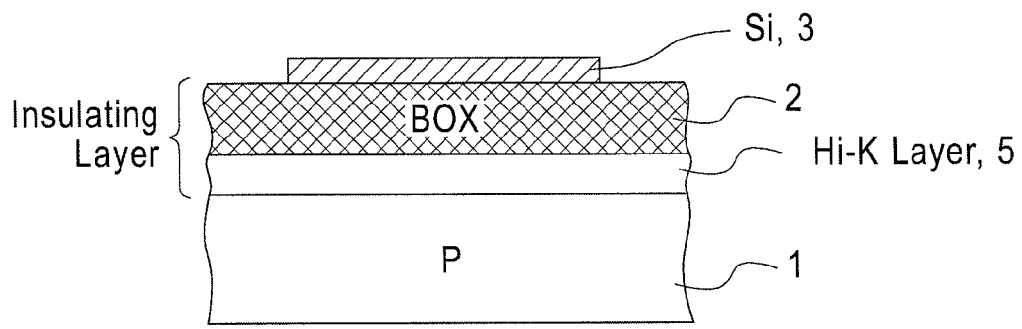
FIG. 5 shows a portion of the structure of any one of FIG. 1, 2 or 4 where there is a relatively thin layer of high dielectric constant (Hi-K) material interposed between the BOX and the substrate.

FIG. 5 shows a portion of the structure of any one of FIG. 1, 2A. 2B, 2C or 4 where there is a relatively thin (e.g., 5 nm) layer 5 of high dielectric constant (Hi-K) material, such as $HfO_2$, that is interposed between the BOX 2 and the starting substrate on which functional region 1 is formed. In this case the $HfO_2$ layer 5 that forms a part of the insulating layer functions as an etch stop to avoid problems that may arise during the processing of the structure by preventing an overetch condition that would extend completely through the BOX 2 and possibly into the substrate. In this embodiment then there is the 20 nm buried oxide 2 and also the 5 nm buried $HfO_2$ layer 5 for increasing isolation, where the equivalent oxide thickness (EOT) is about 21 nm due to the presence of the $HfO_2$ layer 5. The process flow can be substantially identical to the process flow described above with respect to FIG. 4. The dual logic Vt design is achieved at least in part by the different back gate doping types and the thin BOX (EOT~21 nm).

Figure 6:
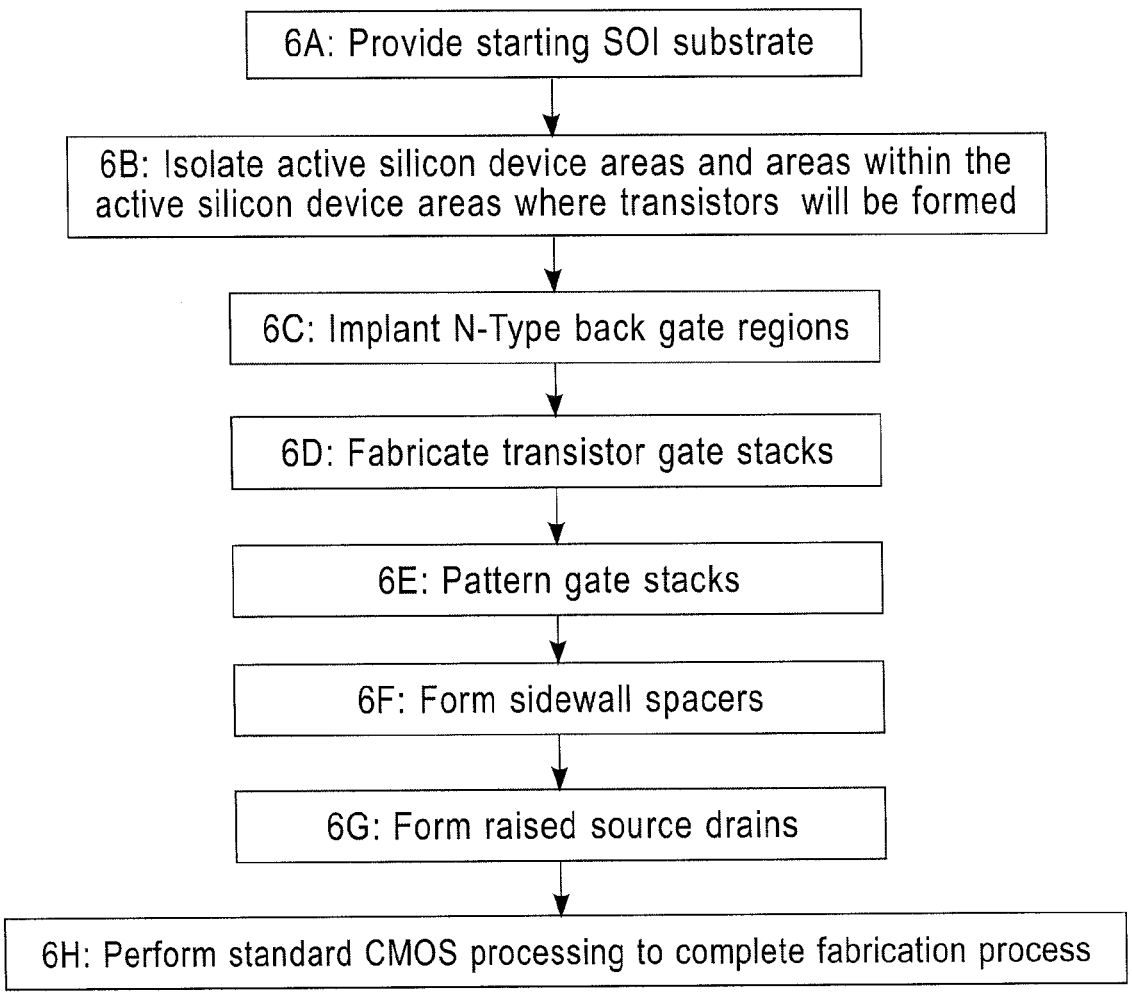
FIG. 6 is a non-limiting example of a process (fabrication) flow diagram.

A more detailed description of an exemplary fabrication process flow is now provided with reference to FIG. 6. In Block 6A a starting substrate is provided. The starting substrate is preferably a silicon on insulator (SOI) substrate and, more specifically, an ETSOI substrate. In one embodiment the insulator layer is an oxide layer having a thickness of about 20 nm (the BOX 2). In another embodiment the insulator layer comprises the oxide layer (~20 nm) on top of the $HfO_2$ layer 5 (~5 nm). There is a thin silicon layer 3 on top of the insulator layer. The thickness of the top silicon layer 3 can be about 7 nm (e.g., in the range of about 5 nm to about 10 nm). The silicon substrate 1 in one embodiment is uniformly doped by boron or indium (p-type dopants) at a concentration of approximately $1 \times 10^{18}/cm^3$. In another embodiment the silicon substrate 1 is more lightly doped by boron or indium ($<1 \times 10^{18}/cm^3$).

In Block 6B shallow-trench isolation (STI) is performed to isolate active silicon device areas. This includes removal of the Si layer 3 in isolation regions between active silicon device areas followed by a refill of the trench with an oxide layer and then a polish back to form a planar surface. The locations where nFET and pFET devices will be formed are isolated from one another by STI. In addition the locations where the RVT devices and the HVT devices will be formed are also isolated by STI.

As was noted above, the addition of the thin $HfO_2$ layer 5 is to provide for more robust isolation between the top silicon layer 3 and the silicon substrate 1. Nominally there can be approximately 27 nm of oxide over the silicon substrate 1 in the isolation region between the active silicon device areas (e.g., 20 nm buried oxide and ~7 nm STI). This oxide layer can be consumed during various wet clean processes and, if too much of the oxide is consumed, can pose a risk of shorting the top silicon layer 3 to the substrate 1 during a subsequent silicon epitaxy process and/or a silicidation process. The $HfO_2$ layer 5 is resistant to wet clean and etch processes that are commonly used and substantially eliminates the potential shorting problem.

In Block 6C the n-type back gate regions 4 are formed underneath the insulator layer, i.e., under the BOX 4 or the BOX 4/$HfO_2$ layer 5, by implanting arsenic or phosphorus through the top silicon layer 3 and the insulator layer. The n-type dopant concentration is made to be greater than the p-type dopant concentration in the substrate (functional region 1). For example, if the doping of the starting substrate is about $1 \times 10^{18}/cm^3$, in the n-implant regions 4 the n-type doping concentration can be approximately $2 \times 10^{18}/cm^3$. If the starting substrate is doped by boron at about $1 \times 10^{18}/cm^3$ then no p-type back gate implant is needed.

However, if the starting substrate is less heavily doped ($<1 \times 10^{18}/cm^3$ p-type) an additional p-type back gate implant can be performed to form the p-type back gate regions 4.

Alternatively, a blanket p-type doping can be performed to increase the doping concentration of an upper portion of the substrate to about $1 \times 10^{18}/cm^3$, followed by the implanting of the n-type back gates 4. As a non-limiting example, the p-type implant can be performed so as to increase the doping concentration of about the uppermost 100 nm of the substrate 1, and the n-type implants can then be made to cause the n-type back gates 4 to extend about 50 nm into the upper portion of the substrate 1. The additional p-type blanket implant can be considered to differentiate the p-type substrate into the underlying substrate and the overlying functional region 1.

Figure 7:
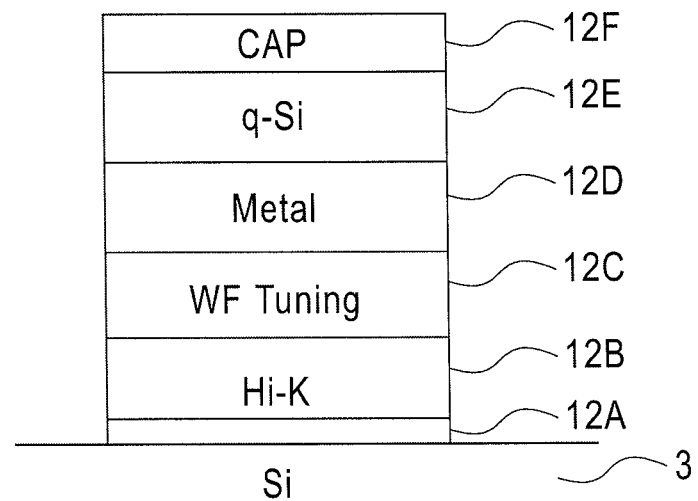
FIG. 7 shows a cross-sectional enlarged view (not to scale) of a non-limiting example of a gate stack structure.

In Block 6D the transistor gate stacks are fabricated. Referring to FIG. 7, each gate stack 12 typically includes a thin oxide interfacial layer 12A, a high-dielectric constant material layer 12B (such as $HfO_2$), a work function tuning capping layer 12C (such as lanthanum or aluminum), a metal layer 12D (such as a titanium nitride layer), and an amorphous silicon layer 12E. Those skilled in the art will appreciate that the work function tuning capping layer 12C can be used to adjust the work function of the gate stack 12 by a few hundred millivolts around the silicon mid-gap level. A nitride capping layer 12F is formed if a raised source-drain is later grown by epitaxy. The relative thicknesses of the various layers in FIG. 7 are not drawn to scale.

In Block 6E the gate stack is patterned using lithography and etching.

In Block 6F sidewall spacers are formed adjacent to the patterned gate by depositing a dielectric layer (such as silicon nitride) followed by an etch back. An optional shallow implant can be used to form a source-drain extension region.

In Block 6G raised source-drain regions are formed by selective silicon epitaxy. For pFETs silicon-germanium epitaxy can be used to enhance device performance. The source-drain region can be doped by implantation, n-type species for nFET and p-type species for pFET, or it can be in-situ doped during the silicon (or silicon-germanium) epitaxy process. A high temperature anneal can then be performed to activate the dopants in the source-drain region and to drive-in the dopants to link up to the gate edge.

Note that in other embodiments a replacement gate process can be used in lieu of the process described above.

In Block 6H standard CMOS processing is performed, including self-aligned silicidation, metallization and contact formation, to complete the fabrication process.

The functional region 1 can be contacted from the back side, or it can be contacted from the top by etching a contact window through the top silicon 3 and buried insulator layer 2 or 2 and 5, and refilling the contact window with conductive material.

While described primarily in the context of a p-type substrate and p-type functional region 1, in other embodiments an n-type substrate and an n-type functional region 1 can be used and the doping type of the other structures adjusted accordingly.

The various dopants and doping concentrations, layer thicknesses and specific materials discussed above are exemplary and can vary from those specifically described and shown.

Figure 8:
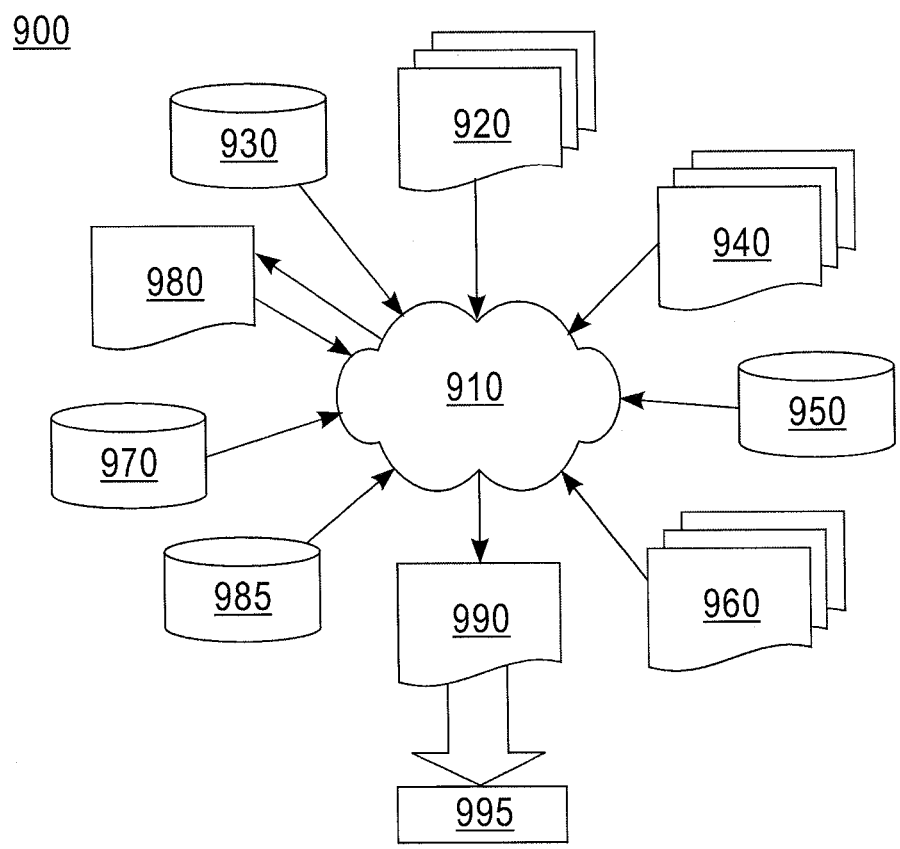
FIG. 8 shows a block diagram of an exemplary design flow used for example, in semiconductor IC logic design, simulation, test, layout, and manufacture.

FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer.

When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is re-synthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990:

proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements that may be found in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the various thicknesses, material types, gate work functions, dopant types and dopant concentrations are exemplary, and variations of the disclosed thicknesses, material types, gate work functions, dopant types and dopant concentrations may be attempted by those skilled in the art. However, all such and similar modifications of the teachings of this invention will still fall within the scope of this invention.

What is claimed is:

1. A structure, comprising:
a functional region in a semiconductor substrate having a first type of conductivity and a top surface, the functional region connected to a contact for applying a bias potential to the functional region;
an insulating layer disposed over the top surface;
a semiconductor layer disposed over the insulating layer;
a first transistor device disposed upon the semiconductor layer and a second transistor device disposed upon the semiconductor layer, each transistor device comprising a source, a drain and a gate stack defining a channel between the source and the drain, where the first transistor device and the second transistor device have the same type of conductivity;

a first back gate region adjacent to the top surface of the functional region and underlying one of the transistor devices, the first back gate region having a second type of conductivity; and a second back gate region adjacent to the top surface of the functional region and underlying the other one of the transistor devices, the second back gate region having the first type of conductivity, where the first back gate region is electrically floating and is biased by leakage and capacitive coupling to the functional region, and the second back gate region is directly connected to the functional region.

2. The structure of claim 1, where gate work functions of the first and second transistor devices are the same, and where the first transistor device has a first characteristic threshold voltage and the second transistor device has a second characteristic threshold voltage that differs from the first characteristic threshold voltage.

3. The structure of claim 2, and further comprising:
a third transistor device and a fourth transistor device, where the third transistor device and the fourth transistor device have the same type of conductivity which is different from that of the first and second transistor devices, where the third transistor device and the fourth transistor device have the same gate work function which is different from that of the first and second transistor devices;

a third back gate region adjacent to the top surface of the functional region and underlying one of the third and fourth transistor devices, the third back gate region having the second type of conductivity; and a fourth back gate region adjacent to the top surface of the functional region and underlying the other one of the third and fourth transistor devices, the fourth back gate region having the first type of conductivity, where the third back gate region is electrically floating and is biased by leakage and capacitive coupling to the functional region, the fourth back gate region is biased by an ohmic connection to the contact, and where the third transistor device has a third characteristic threshold voltage and the fourth transistor device has a fourth characteristic threshold voltage that differs from the third characteristic threshold.

4. The structure of claim 3, where the first transistor and second transistor devices are n-type field effect transistors, where the third transistor device and the fourth transistor device are p-type field effect transistors.

5. The structure of claim 4, where one of the n-type field effect transistors is disposed over the p-type back gate region to obtain a higher threshold voltage than the other one of the n-type field effect transistors disposed over the n-type back gate region, and the one of the p-type field effect transistors is disposed over the n-type back gate region to obtain a higher threshold voltage than the other one of the p-type field effect transistors.

6. The structure of claim 4, where a gate work function for the n-type field effect transistor is above a mid band gap level of the silicon layer, and where a gate work function for the p-type field effect transistor is one of equal to or below the mid band gap level of the silicon layer, such that the first and second characteristic threshold voltages of the n-type field effect transistors are symmetric to the third and fourth characteristic threshold voltages of the p-type transistors.

7. The structure of claim 6, where the bias potential is selected in part based on the gate work functions to balance the threshold voltages of the n-type field effect transistors and the threshold voltages of the p-type field effect transistors.

8. The structure of claim 1, where the semiconductor layer disposed over the insulating layer is a silicon layer having a thickness in a range of about 5 nm to about 10 nm, where the insulating layer has a thickness in a range of about 10 nm to about 50 nm, and further comprising an etch stop layer disposed between the insulating layer and the top surface.

9. The structure of claim 3, where the first, second, third and fourth transistor devices are logic transistor devices, and further comprising a static random access memory comprising a fifth transistor device disposed upon the semiconductor layer and a sixth transistor device disposed upon the semiconductor layer, where each of the fifth and sixth transistor devices comprises a source, a drain and a gate stack defining a channel between the source and the drain, where the fifth transistor device is an n-type field effect transistor and the sixth transistor device is a p-type field effect transistor, and where the fifth transistor device and the sixth transistor device have the same gate stack work function; and a back gate plate adjacent to the top surface of the functional region and underlying both the fifth and sixth transistor devices, the back gate plate having a second type of conductivity, where the back gate plate is one of electrically floating and is biased by leakage and capacitive coupling to the functional region, or is connected to a back gate plate bias contact.

10. A structure, comprising:
a functional region having a first type of conductivity and a top surface, the functional region connected to a first contact for applying a bias potential to the functional region;

an insulating layer disposed over the top surface;
a semiconductor layer disposed over the insulating layer;
a first transistor device disposed upon the semiconductor layer and a second transistor device disposed upon the semiconductor layer, each transistor device comprising a source, a drain and a gate stack defining a channel between the source and the drain, where the first transistor device has a first type of conductivity and the second transistor device has a second type of conductivity; and a back gate plate adjacent to the top surface of the functional region and underlying both the first and second transistor devices, the back gate plate having a second type of conductivity, where the back gate plate is one of electrically floating and is biased during operation by leakage and capacitive coupling to a same potential as the functional region with which it forms a diode junction, or is biased through a back gate plate contact;

the structure further comprising a third transistor device disposed upon the semiconductor layer and a fourth transistor device disposed upon the semiconductor layer, each of the third and fourth transistor devices comprising a source, a drain and a gate stack defining a channel between the source and the drain, where the third and fourth transistor devices have the same type of conductivity;

a first back gate region adjacent to the top surface of the functional region and underlying one of the third and fourth transistor devices, the first back gate region having the second type of conductivity; and a second back gate region adjacent to the top surface of the functional region and underlying the other one of the third and fourth transistor devices, the second back gate region having the first type of conductivity, where the first back gate region is electrically floating and is biased during operation by leakage and capacitive coupling to the same potential as the functional region with which it forms a diode junction, where the second back gate region is directly connected to the functional region.

11. The structure of claim 10, where the gate stack of the first transistor device has a work function and the gate stack of the second transistor device has the same work function as the gate stack of the first transistor device, where the work function is approximately equal to a mid band gap level of the silicon layer, where the third and fourth transistor devices have the same gate stack work functions, where the third and fourth transistor devices have different characteristic threshold voltages, and where the first and second transistor devices comprise memory cell transistor devices, and where the third and fourth transistor devices comprise logic circuit transistor devices.

* * * * *